(12) United States Patent
Scanzillo et al.

(10) Patent No.: US 9,859,698 B2
(45) Date of Patent: Jan. 2, 2018

(54) FLOOR BOX COVER

(71) Applicant: Hubbell Incorporated, Shelton, CT (US)

(72) Inventors: Thomas L. Scanzillo, Monroe, CT (US); Michael J. Marchetti, Bridgeport, CT (US); Christopher A. Carbone, Newton, CT (US); Ryan G. Papageorge, Shelton, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 15/131,246

(22) Filed: Apr. 18, 2016

(65) Prior Publication Data

US 2016/0308340 A1    Oct. 20, 2016

Related U.S. Application Data

(60) Provisional application No. 62/149,033, filed on Apr. 17, 2015.

(51) Int. Cl.
| | |
|---|---|
| *H02G 3/10* | (2006.01) |
| *H02G 3/08* | (2006.01) |
| *H02G 3/14* | (2006.01) |
| *H02G 3/18* | (2006.01) |
| *H05K 5/02* | (2006.01) |
| *H05K 5/03* | (2006.01) |

(52) U.S. Cl.
CPC ............. *H02G 3/105* (2013.01); *H02G 3/083* (2013.01); *H02G 3/085* (2013.01); *H02G 3/14* (2013.01); *H02G 3/185* (2013.01); *H05K 5/0226* (2013.01); *H05K 5/03* (2013.01)

(58) Field of Classification Search
USPC ............................................... 174/50
See application file for complete search history.

(56) References Cited

U.S. PATENT DOCUMENTS

| | | | |
|---|---|---|---|
| 2,186,903 A | 1/1940 | Gleason | |
| 4,228,317 A | 10/1980 | Cziment | |
| 4,483,355 A | 11/1984 | Yuhara | |
| 4,585,139 A | 4/1986 | Bronson et al. | |

(Continued)

FOREIGN PATENT DOCUMENTS

| | | |
|---|---|---|
| GB | 2241389 A | 8/1991 |
| WO | 2014149560 | 9/2014 |

OTHER PUBLICATIONS

PCT/US2016/028043 International Search Report and Written Opinion dated Jul. 13, 2016.

*Primary Examiner* — Dhirubhai R Patel
(74) *Attorney, Agent, or Firm* — Michael Best & Friedrich, LLP

(57) ABSTRACT

A cover assembly for a floor box includes a base and a cover. The base defines a central opening for accessing the floor box. The cover is moveable with respect to the base and is sized to close the central opening. A hinge body is connected to the cover and pivotally connected to the base. A hinge pin is connected to the hinge body through an interference fit and connected to the base. A cord access opening is provided in the cover. An access door is connected to the cover and moveable between an open position and a closed position. A biasing member applies a force against the access door to retain the access door in a desired position.

19 Claims, 11 Drawing Sheets

(56) References Cited

U.S. PATENT DOCUMENTS

| | | | |
|---|---|---|---|
| 4,675,940 A | 6/1987 | Brockhaus | |
| 4,684,017 A | 8/1987 | Watanabe et al. | |
| 4,721,476 A | 1/1988 | Zeliff et al. | |
| 4,828,299 A | 5/1989 | Poe | |
| 4,928,350 A | 5/1990 | Morgan | |
| 5,535,437 A | 7/1996 | Karl et al. | |
| 5,686,701 A | 11/1997 | Fukushima et al. | |
| 6,109,669 A | 8/2000 | Pinkow | |
| 6,145,352 A | 11/2000 | Vickers et al. | |
| 6,265,662 B1 * | 7/2001 | Riedy | H02G 3/185 174/66 |
| 6,274,809 B1 | 8/2001 | Pudims et al. | |
| 6,530,250 B1 | 3/2003 | Linares et al. | |
| 6,563,297 B1 | 5/2003 | Boswell et al. | |
| 6,564,428 B2 | 5/2003 | Richard et al. | |
| 6,588,624 B1 | 7/2003 | Connors et al. | |
| 6,669,041 B2 * | 12/2003 | Almond | H02G 3/383 220/3.6 |
| 6,719,332 B2 | 4/2004 | Sekylovic | |
| 6,857,538 B2 | 2/2005 | Lin | |
| 6,866,442 B1 | 3/2005 | Petersen | |
| 7,083,205 B2 | 8/2006 | Hall | |
| 7,301,100 B2 | 11/2007 | Drane et al. | |
| 7,459,632 B2 | 12/2008 | Bowman | |
| 7,579,549 B2 | 8/2009 | Jolly | |
| 7,635,110 B2 | 12/2009 | Galasso et al. | |
| 7,798,540 B1 | 9/2010 | Vitry et al. | |
| 7,851,703 B2 | 12/2010 | Drane | |
| 8,119,912 B2 | 2/2012 | Thibault et al. | |
| 8,759,674 B2 | 6/2014 | Korez et al. | |
| 9,236,723 B2 | 1/2016 | Scanzillo et al. | |
| 9,362,731 B2 | 6/2016 | Carbone et al. | |
| 9,373,944 B2 | 6/2016 | Scanzillo et al. | |
| 2002/0092664 A1 | 7/2002 | Young et al. | |
| 2007/0277457 A1 | 12/2007 | Langston et al. | |
| 2008/0054135 A1 | 3/2008 | Galasso et al. | |
| 2009/0159308 A1 | 6/2009 | Thibault et al. | |
| 2010/0072198 A1 | 3/2010 | Roemer et al. | |
| 2010/0206603 A1 | 8/2010 | Drane | |
| 2010/0236023 A1 | 9/2010 | Wang et al. | |
| 2010/0244464 A1 | 9/2010 | Rajagopal et al. | |
| 2010/0300745 A1 | 12/2010 | Boyle et al. | |
| 2011/0049152 A1 | 3/2011 | Raghunathan et al. | |
| 2012/0312577 A1 | 12/2012 | Carbone et al. | |

\* cited by examiner

FLOOR BOX COVER

RELATED APPLICATIONS

This application is based on U.S. Provisional Application Ser. No. 62/149,033, filed Apr. 17, 2015, the disclosure of which is incorporated herein by reference in its entirety and to which priority is claimed. This application is being filed simultaneously with U.S. application Ser. No. 15/131,266, titled FLOOR BOX AND METHOD OF INSTALLING, claiming priority to the same provisional application, which is also incorporated herein by reference in its entirety.

FIELD

Various exemplary embodiments relate to floor boxes, including recessed and raised access floor boxes.

BACKGROUND

Electrical floor boxes are known in the art for covering outlets or receptacle and other electrical devices when not in use. The floor box can include separate compartments for power, data, and phone receptacles. Often the floor box has a hinged cover that pivots from a closed position to an open position. Many floor boxes have a top surface that is raised from the floor creating a lip that interferes with the use of the box.

SUMMARY

According to an exemplary embodiment, a cover assembly for a floor box includes a base and a cover. The base defines a central opening for accessing the floor box. The cover is moveable with respect to the base and is sized to close the central opening. A hinge body is connected to the cover and pivotally connected to the base. A hinge pin is connected to the hinge body through an interference fit and connected to the base. A cord access opening is provided in the cover. An access door is connected to the cover and moveable between an open position and a closed position. A biasing member applies a force against the access door to retain the access door in a desired position.

According to another exemplary embodiment, a cover assembly for a floor box includes a base defining a central opening for accessing the floor box. A cover is moveable with respect to the base and sized to close the central opening. A hinge assembly includes a hinge body connected to the cover and pivotally connected to the base and a hinge pin connected to the hinge body through an interference fit. A cord access opening is provided in the cover. An access door is connected to the cover and moveable between an open position and a closed position. A biasing member including a spring bracket applies a force against the access door to retain the access door in a desired position.

According to another exemplary embodiment, a cover assembly for a floor box includes a base defining a central opening for accessing the floor box. A cover is moveable with respect to the base and sized to close the central opening. The cover has a recess formed in an upper surface. A piece of flooring material is positioned in the recess. A hinge assembly pivotally connects the cover to the base. A cord access opening is provided in the cover. An access door is connected to the cover and moveable between an open position and a closed position. A biasing member including a spring bracket having a resilient arm applies a force against the access door to retain the access door in a desired position.

BRIEF DESCRIPTION OF THE DRAWINGS

The aspects and features of various exemplary embodiments will be more apparent from the description of those exemplary embodiments taken with reference to the accompanying drawings, in which.

The following is a brief description of the drawings in which.

DETAILED DESCRIPTION OF EXEMPLARY EMBODIMENTS

In an exemplary embodiment, a cover assembly 10 includes a base 12 and cover 14. The cover assembly 10 is configured to connect to an electrical box 16. The electrical box 16 in the embodiment shown is a floor mounted box that is intended to be mounted in the floor of a building so that the electrical components are accessible to the user. The electrical box 16 can be any suitable construction as known in the art and is mounted in the floor so that the top edge is substantially flush with the floor surface. In the embodiment shown, the electrical box 16 has an open top end configured for receiving to the cover assembly 10. The electrical box 16 typically encloses electrical wiring device such as electrical receptacles, video connections and data connections.

Figure 2:
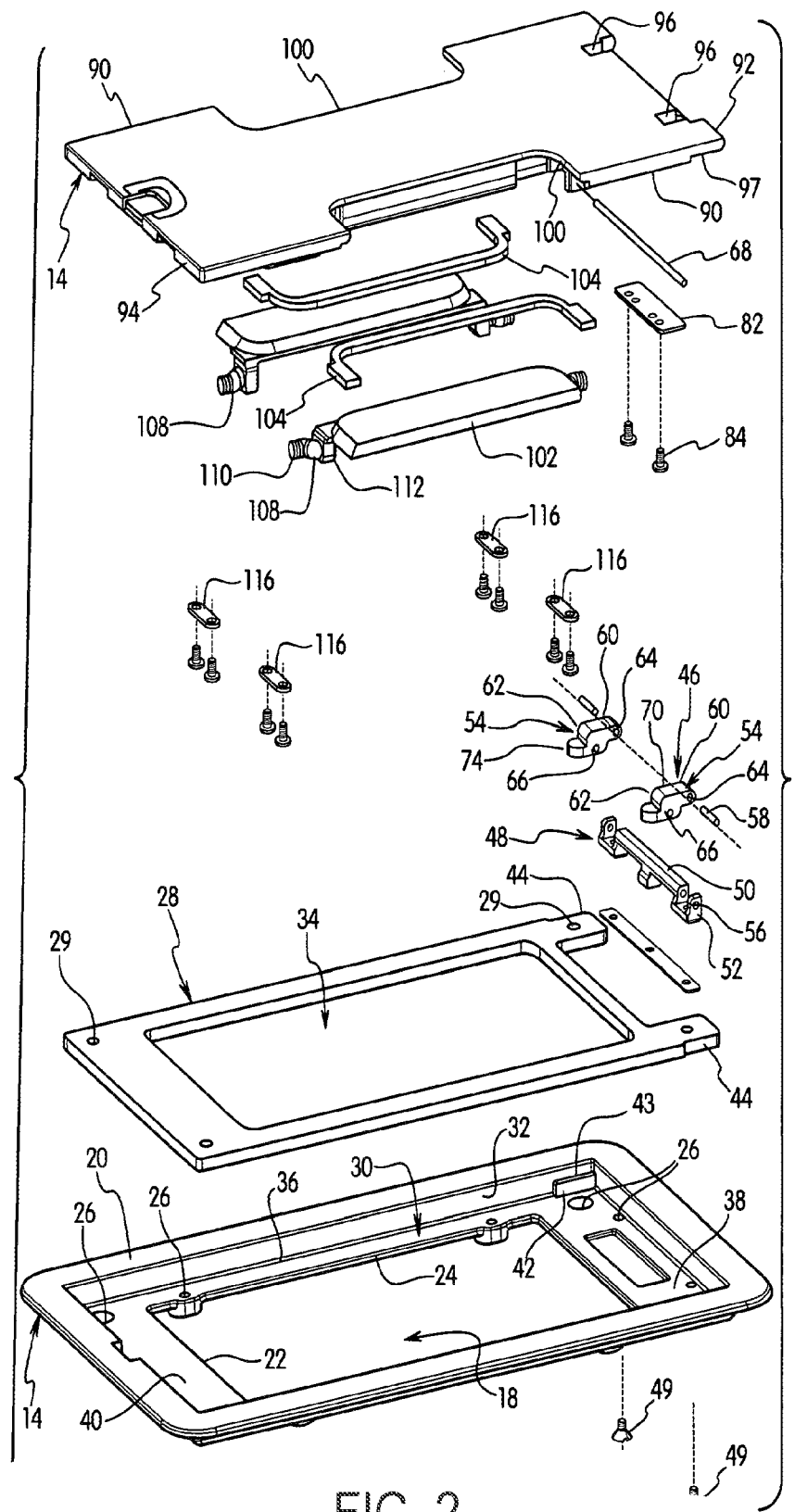
FIG. 2 is an exploded view of an exemplary cover assembly.

As shown in FIG. 2, the base 12 has a substantially rectangular configuration although the shape and dimensions of the base 12 can vary depending on the intended use and the dimensions of the electrical box 16. The base 12 has a central opening 18 for allowing access to the electrical components within the electrical box 16. The base 12 has a substantially flat top surface 20 and a recessed area 30 defined by an inwardly extending flange 22. The flange 22 is positioned below and recessed with respect to the top surface 20 of the base 12 to form the recessed area 30 below the top surface 20 of the base 12. A side wall 32 extends between the flange 22 and the top surface 20 of the base 12 to define the depth of the recessed area 30. The inner edge 24 of flange 18 defines the dimensions of the central opening 18. The flange 22 completely surrounds the central opening 18 to form a continuous surface. A plurality of screw apertures 26 are formed in the flange 22 for receiving mounting screws to attach the base to the top end of the electrical box 16.

A gasket 28 is provided in the recessed area 30 on the flange 30 to form a seal between the cover 14 and the base 12 when the cover 14 is closed. The gasket 28 is preferably made from a resilient rubber material that is able to form a waterproof or water tight seal between the cover 14 and the base 12 to prevent water and dirt from entering the box 16. As shown in FIG. 2, the gasket 28 has an outer dimension corresponding to the inner dimension of the recessed area 30 of the base 12 so that the gasket 28 fits within the recessed area 30. The gasket 28 is provided with a central opening 34 have a dimension corresponding to the dimension of the central opening 18. Preferably the gasket 28 surrounds the central opening 18 with a continuous surface to provide the water tight seal between the cover 14 and the base 12. An adhesive can attach the gasket 28 to the top surface of the flange 22 to prevent separation of the gasket 28 from the cover assembly 10. A plurality of holes 29 in the gasket 28 overlay the screw holes 26 for accessing the mounting screws within the screw holes 26.

Figure 1:
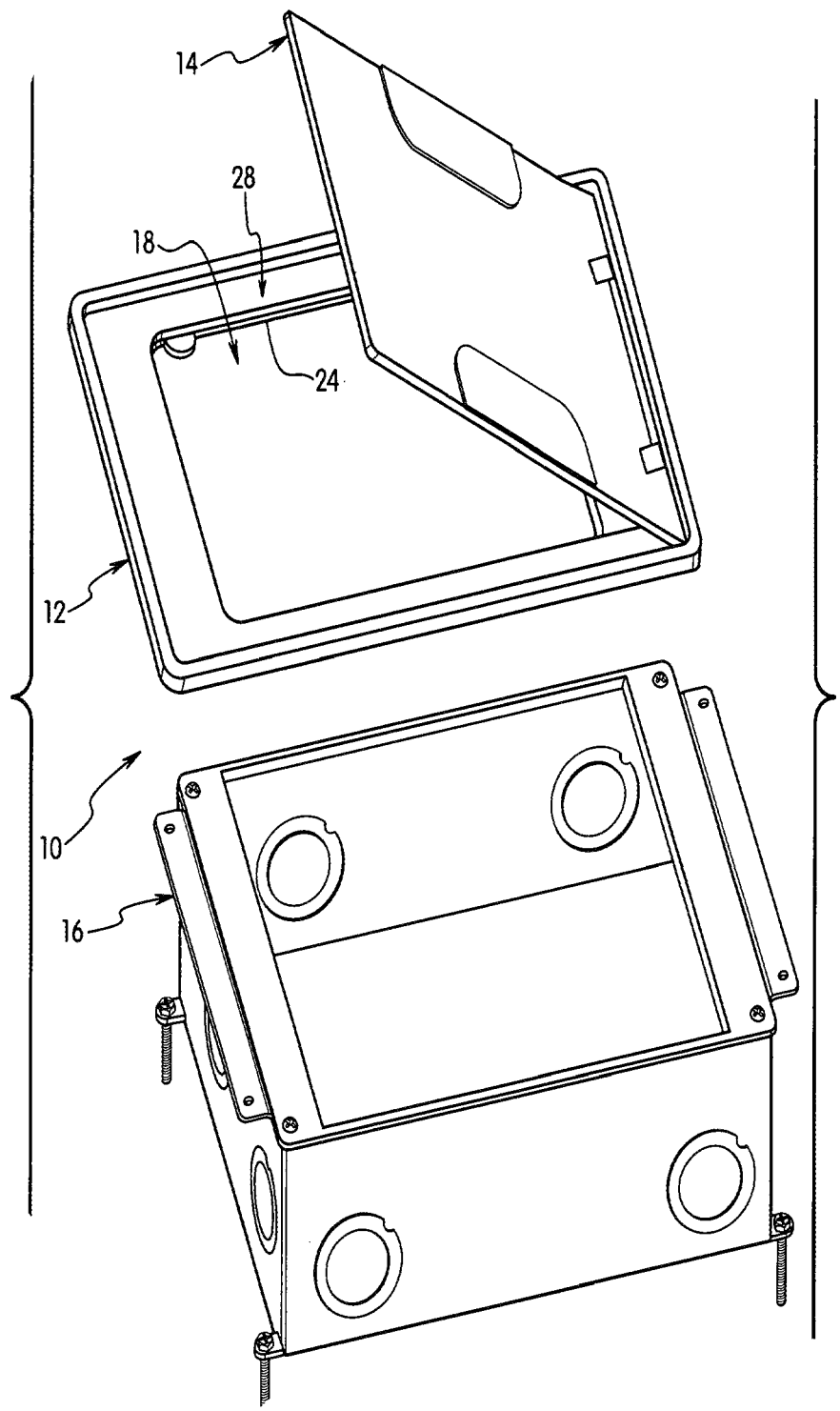
FIG. 1 is an exploded view of an exemplary floor box and cover assembly.

The flange 22 has a width to mate with cover 14. The flange 22 is formed with longitudinal side portions 36, a first end portion 38 and a second end portion 40 opposite the first end portion 38. In the embodiment shown in FIG. 2, the flange 22 and side wall 36 of base 12 forming the recessed area 30 include a raised member 42 proximate the first end portion 38. The raised members 42 in the embodiment shown are provided at each corner of the recessed area 30 at the first end portion 38. In one embodiment, the gasket 28 has a thickness corresponding to the height of the raised member 42 so that the top flat face 43 of the raised member 42 is substantially flush with the top surface of the gasket 28. As shown in FIG. 2, the gasket 28 has a notched portion 44 in the two opposite corners to receive the raised members 42. In the embodiment shown in FIG. 2, a raised portion 42 is provided in two corners of the recessed area at the first end portion 38 of the flange 22. Alternatively a raised member can be provided in each of the four corners of the recessed area 30 as shown in FIG. 1.

Figure 3:
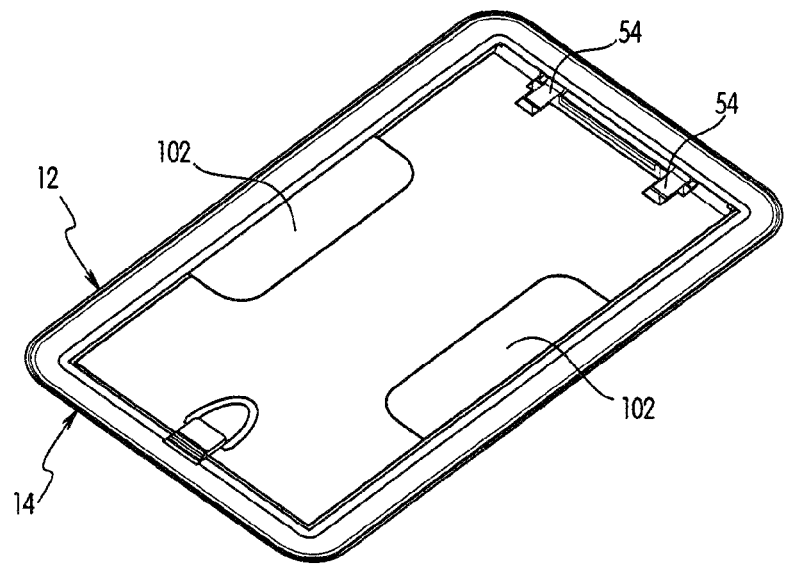
FIG. 3 is a top view of the cover assembly of FIG. 2.

The cover 14 is pivotally coupled to the base 12 by a hinge assembly 46. The hinge assembly 46 is configured to enable the cover 14 to pivot between a closed position shown in FIG. 3 and an open position shown in FIG. 4. Preferably the hinge assembly 46 allows the cover to pivot open so that the cover 14 lays flat on the top surface 20 of the base 12 and the surface of the floor in which the cover assembly and electrical box are mounted. The hinge assembly 46 also enables the cover 14 to pivot to the closed position shown in FIG. 3 where the cover 14 is seated in the recessed area 30 of the base 12 with the top surface of the cover 14 substantially flush with the top surface 20 of the base 12. The hinge assembly 46 provides a full range of pivoting movement of about 180 degrees.

Figures 9, 10:
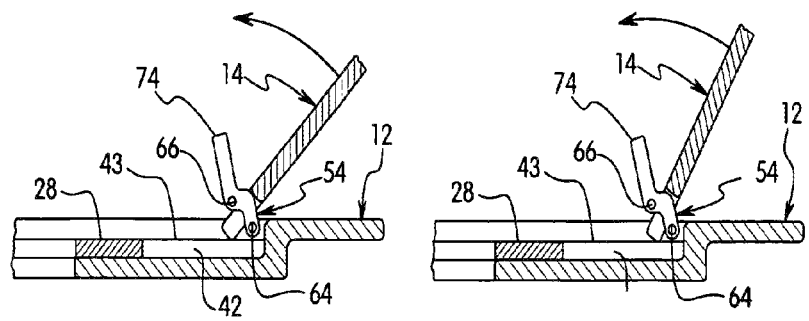
FIG. 9 is a partial cross-sectional side view of the hinge assembly showing the cover being pivoted from the open position to the closed to the open position and showing the cover sliding on the slide surface.
FIG. 10 a partial cross-sectional side view of the hinge assembly of FIG. 9 showing the cover pivoting toward the closed position.
Figure 11:
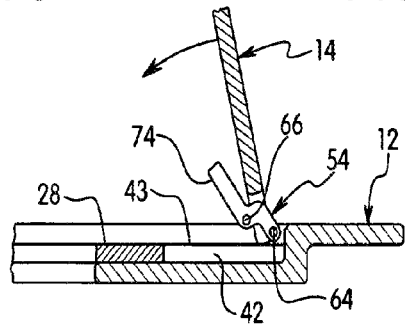
FIG. 11 is a partial cross-sectional side view of the cover of FIG. 10 pivoting to the closed position.

The hinge assembly 46 includes a hinge mounting bracket 48 that is coupled to the first end portion 38 of the flange 22 as shown in FIG. 2 and FIG. 10. The hinge mounting bracket 48 is attached to the flange 22 by screws 49, rivets or other suitable fasteners. The mounting bracket 48 in the embodiment shown has a body portion 50 with a U-shaped member 52 at each end for pivotally coupling to a hinge body 54. As shown in FIG. 11 the body 50 of the hinge mounting bracket 48 is spaced from the flange 22 and has a top end substantially flush with the top surface of the base 12. Each U-shaped member 52 has a bore 56 for receiving a pivot pin 58. In one embodiment, two U-shaped members 52 are provided for supporting two hinge bodies 54 for supporting the cover 14.

Each hinge body 54 is configured for pivotally coupling the cover 14 to the base 12 and allowing a full range of pivoting motion between the cover 14 and the base 12. The hinge body 54 has a longitudinal dimension with a first end 60 and a second end 62. The first end 60 of the hinge body 54 has bore 64 for receiving the pivot pin 58 and pivotally coupling the hinge body 54 to the bracket 48 and the base 12. The bore 64 and pivot pin 58 define a first pivot axis of the hinge body 54 with respect to the base 12. The hinge body 58 is able to pivot with respect to the bracket 48 and the base 12 between a first position overlaying the flange 22 and extending in a direction substantially parallel to the flange 22 with the cover 14 in the closed position and a position extending in an upward direction substantially perpendicular to the flange 22 with the cover 14 in the open position.

The second end 62 of the hinge body 54 has a bore 66 for receiving a pivot pin 68 for pivotally coupling the cover 14 to the hinge body 54. The bore 66 and pin 68 define a second pivot axis of the hinge body 54 spaced from the first pivot axis in a longitudinal direction with respect to the longitudinal dimension of the hinge body 54. In the embodiment shown, the bore 66 lies in a plane that is offset from the plane of the bore 64. In this manner the bores 64 and 66 define two pivot axes that are spaced apart along the longitudinal dimension of the hinge body 54 and spaced apart in a generally transverse direction of the hinge body 54 so that the bore 64 is spaced adjacent a first side 70 of the hinge body 54 and the bore 66 is adjacent a second side 72 of the hinge body 54.

Figure 5A:
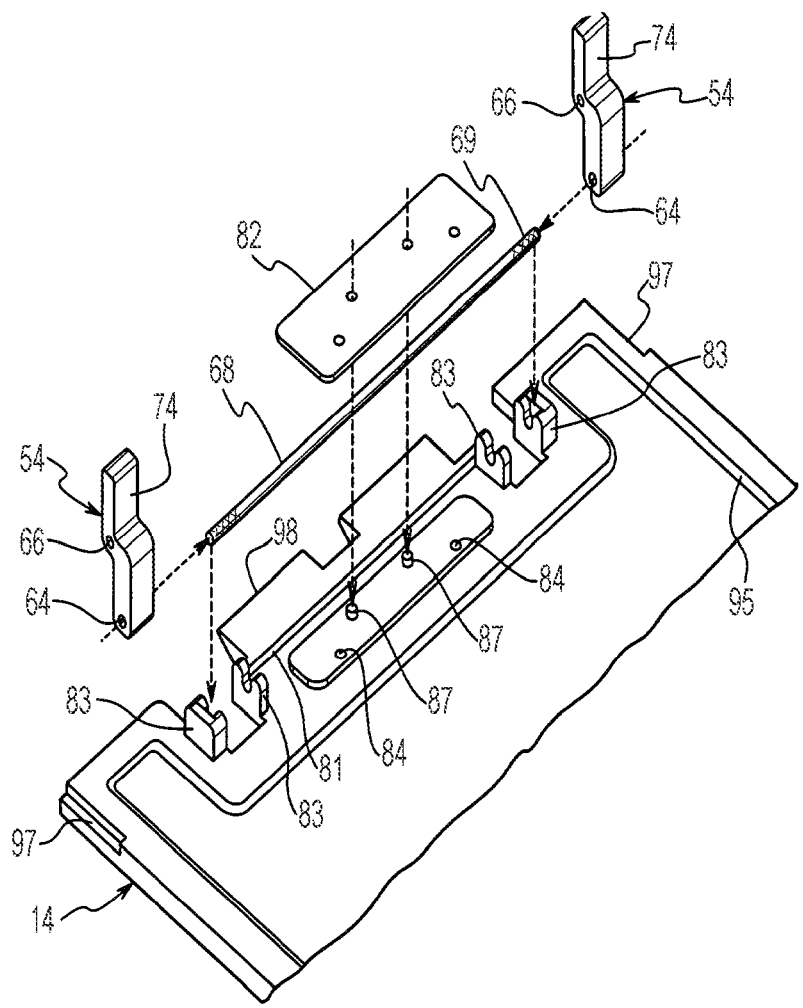
FIG. 5A is a partial exploded view of the hinge assembly.

As shown in FIGS. 2 and 5A-ii, the hinge body 54 has a tab 74 extending from the second end 62 in a substantially longitudinal direction. In the embodiment shown, the tab 74 is aligned with the second bore 66 and is offset from a center longitudinal axis of the hinge body 54. The cover 14 has a first end 92 with two slots or recessed portions 76 for receiving the respective hinge body 54. A hinge pin 68 is recessed in groove 81 extending between hinge lugs 83 and is coupled to the bottom side of the cover 14 by a mounting plate 82 that is attached to the bottom side of the cover 14 by rivets 84, screws or other fasteners. Bosses 87 extend upward from the inner face of the cover 14 to align the plate during assembly. The hinge pin 68 is aligned with the recessed portions 78 and extends through the bores 66 of the hinge body 54 to pivotally couple the hinge body 54 to the cover 14.

Figure 5B:
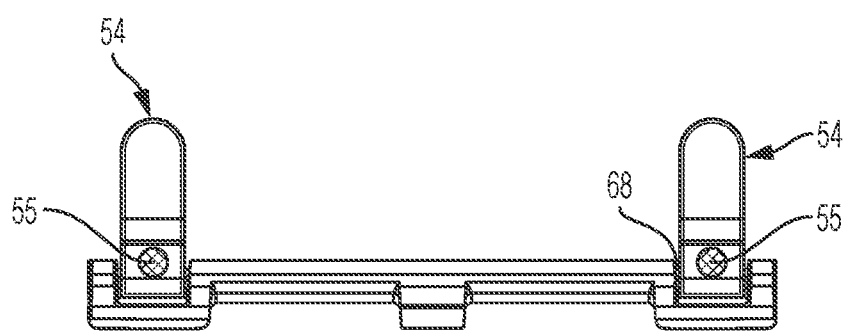
FIG. 5B is a partially view of an alternative hinge assembly.

In various exemplary embodiments, the hinge pin 68 and hinge body 54 can have an interface to prevent or resist relative movement of the hinge pin, for example a friction or interference fit. In the embodiment shown in FIG. 5A, a friction surface 69, for example a knurled surface is provided on the hinge pin 68 to engage with the hinge body 54. In the embodiment shown in FIG. 5B, a smooth pin is provided and a friction interface 55, for example a dimpling or distorted section is formed on the hinge body 54. A press can be used to distort the material or the inner diameter of the hinge body 54 so that an interference fit is formed between the hinge body 54 and the hinge pin 68.

Figure 6:
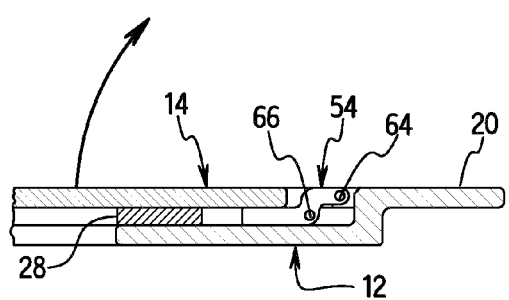
FIG. 6 is a partial cross-sectional side view of the hinge assembly showing the cover in the closed position.
Figure 7:
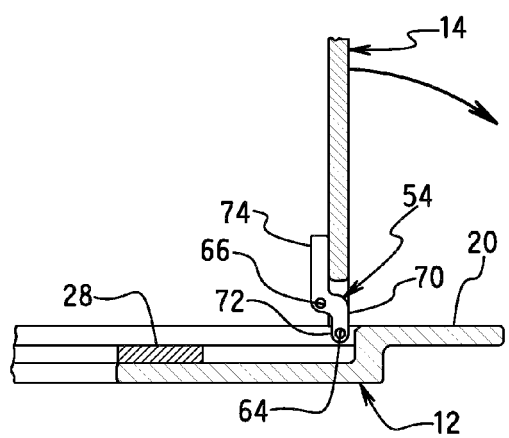
FIG. 7 is a partial cross-sectional side view of the hinge assembly showing the cover partially open.

The hinge body 54 enables the cover 14 to pivot freely between the open position and the closed position to lay flat against the top surface of the base 12 and the floor surface. Referring to FIG. 6, the cover 14 seats on the gasket 28 and the hinge body 54 lies against the surface of the flange 22 in the closed position. The hinge body 54 preferably has a dimension so that the side edge 70 is substantially flush with the top surface of the cover 14 and the base 12. The cover 14 pivots toward the open position shown in FIG. 7 about the first pivot axis so that the hinge body 54 pivots upwardly until the hinge body makes contact the top edge of the recessed area 30. The cover 14 continues to pivot to the open position shown in FIG. 8 about the second pivot axis to lay flat on the top surface of the base 12 and the floor surface.

To close the cover 14 the cover is pivoted from the position shown in FIG. 9 toward the position shown in FIG. 11. In the first portion of the pivotal movement, the cover 12 pivots about the first pivot axis defined by the pivot pin 58 in the bore 64 at the first end of the hinge body 54 until the bottom face of the cover 14 contacts the tab 74 as shown in FIG. 11. The contact of the bottom face of the cover 14 with the tab 74 causes the hinge body 54 to continue pivoting simultaneously with the cover 12 to the closed position shown in FIG. 6. The tab 74 limits the pivoting movement between the hinge body 54 and the cover 14 so that the hinge body 54 pivots to the closed position by pivoting about the first pivot axis of the pin 58. The tab 74 prevents the first end of the cover 14 from lifting upward from base when the second end of the cover is latched to the base. The tab 74 prevents the hinge body 54 from pivoting about the first pivot axis without pivoting the cover open.

Figure 8:
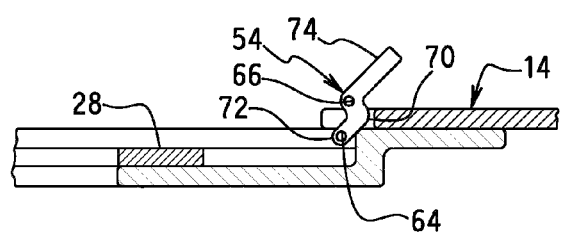
FIG. 8 is a partial cross-sectional side view of the hinge assembly showing the cover in the open position and laying flat against the top surface of the base.

The end of the cover 14 engages the slide surface 43 of the raised member 42 during opening and closing of the cover 14 as depicted in FIGS. 9-11. The top slide surface 43 of the raised member 42 forms a bearing surface for the edge of the cover 14 as shown in FIG. 8. The raised members 42 are positioned on opposite corners of the recessed area forming a bearing or wear resistance surface to contact the edge of the cover 14 during the pivoting movement of the cover 14 with respect to the base 12. The raised members 42 prevent the edges of the cover 14 from sliding over the surface of the gasket 28 during opening and closing of the cover 14 to prevent excessive wear to the soft and resilient gasket material.

Figure 4:
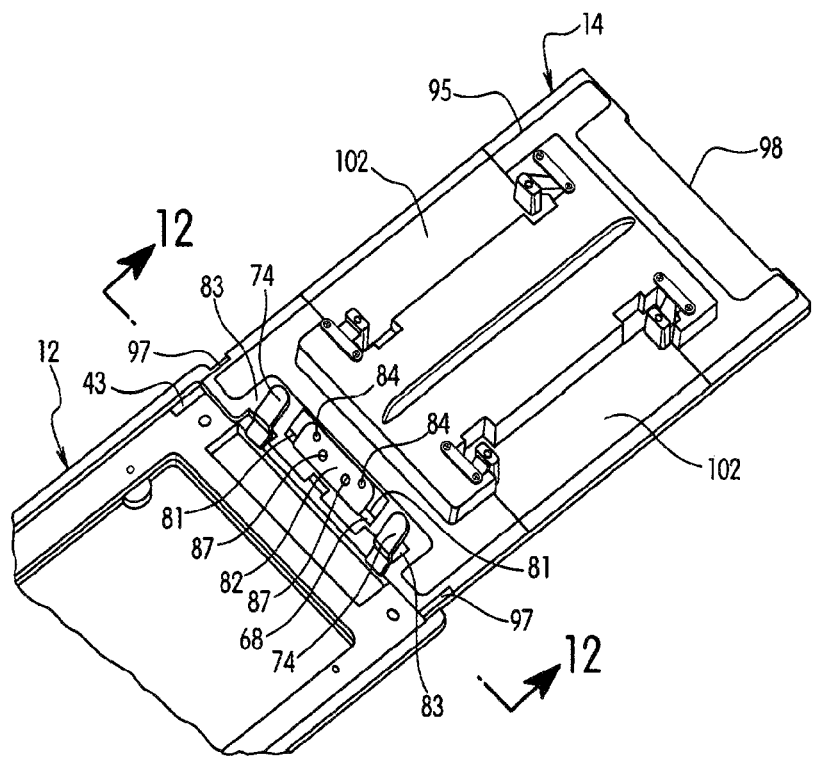
FIG. 4 is partial top perspective view of the cover assembly of FIG. 3 showing the cover in the open position.

The cover 14 as shown in FIG. 2 has a shape and dimension to be received within the recessed area 30 of the base 12. The cover 14 has longitudinal side edges 90, a first hinge end 92, and a second front end 94. A continuous rib 95 extends from the bottom surface of the cover 14 to surround the opening in the base 12 and form a seal against the gasket 28. The rib 95 has a height to extend below the top face of the raised members 42 to ensure contact with the gasket 28 and form a watertight seal. As shown in FIGS. 4 and 5, each of the corners at the hinge end of the cover 14 have a recess 97 with a dimension to receive the top surface of the raised members 42 to enable sealing by the gasket at the corners of the cover 14.

Figure 12:
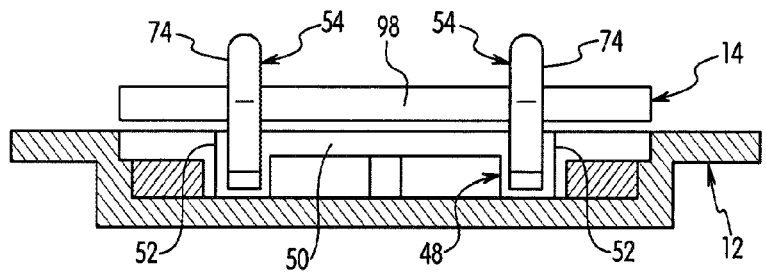
FIG. 12 is cross-sectional view of the base, hinge assembly and cover in the open position taken along line 12-12 of FIG. 4.
Figures 13, 14:
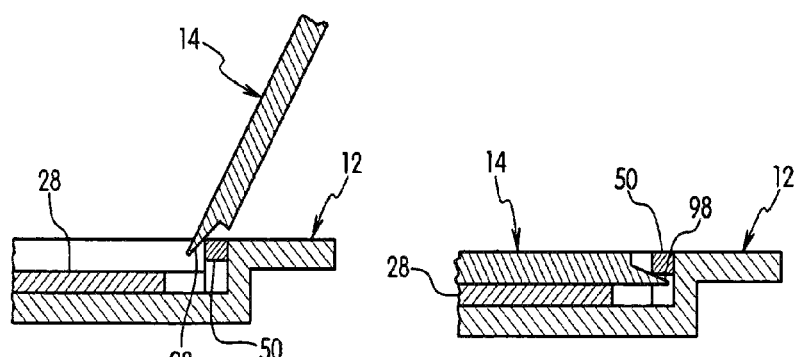
FIG. 13 is a cross-sectional view of the cover engaging the hinge bracket while closing the cover.
FIG. 14 is a cross-sectional view of the cover in the closed position.

The hinge end 92 has a pair of slots 96 for receiving the hinge body 54. As shown in FIGS. 12-14 the center portion of the hinge end 92 between the slots 96 has an inclined face 98 that slopes from the top face toward the bottom face of the cover 14. The inclined face 98 forms a flange that engages the body portion 50 forming a cross member of the hinge bracket 48 during the closing motion of the cover 14 with respect to the base 12 and slides over the surface of the cross member. The inclined face 98 contacts the body portion 50 and slides around and under the body portion 50 during the closing motion of the cover 14 so that the inclined face extends under the body portion 50 when the cover is fully closed as shown in FIGS. 13 and 14.

Figure 15:
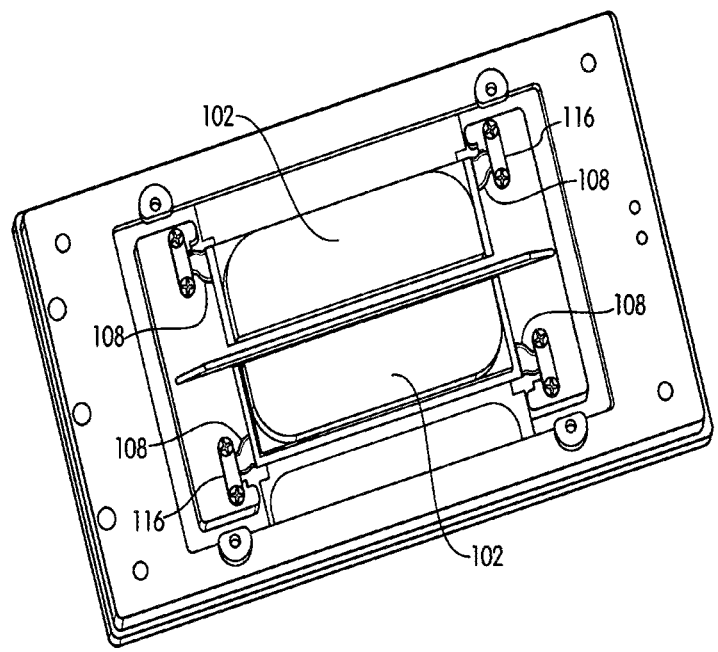
FIG. 15 is a bottom view of the cover assembly showing the access doors of the cover in the open position.
Figure 16:
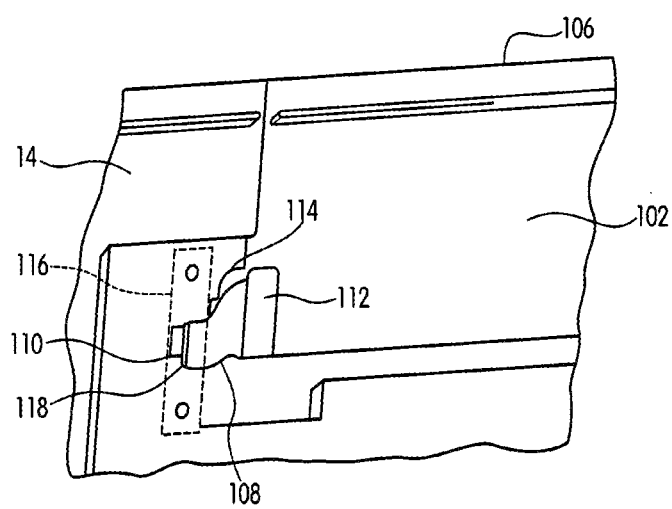
FIG. 16 is a partial bottom view of the hinge of the access doors with the retainer removed showing the hinge assembly and compression spring.
Figure 17:
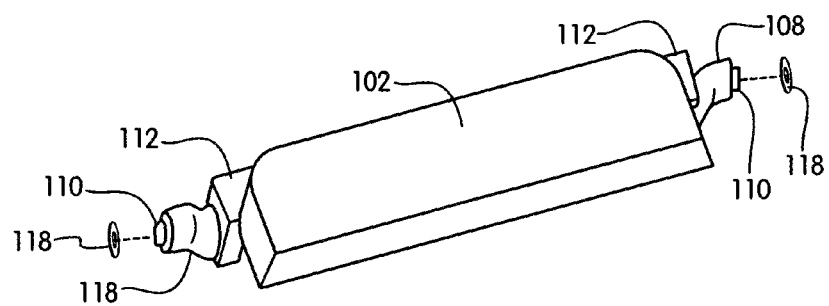
FIG. 17 is an exploded view of the access door with the compression spring washer.
Figure 18:
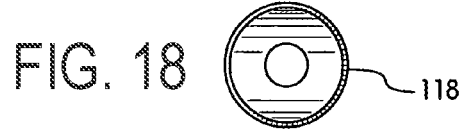
FIG. 18 is top view of the compress spring washer of FIG. 14.
Figure 19:
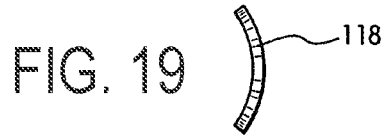
FIG. 19 is a side view of the compression spring washer of FIG. 15.

The side edges 90 of the cover 14 each include an access opening 100 and a movable access door 102 to allow electrical cords to pass through when the cover 14 is closed. Each access door 102 has an inner edge with a gasket 104 and an outer edge 106 for mating with the recessed area 30 and the gasket 28 on the base 12. As shown in FIGS. 15-17, the access doors 102 each have two hinge pins 108 extending from opposite ends for pivotally coupling with the cover 14. The hinge pins 108 in the embodiment shown have a bent configuration so that the bearing 110 of the hinge pins are offset from the base 112 of the hinge pins 108. The bearings 110 of the hinge pins 108 are received in a complementing recess 114 in the cover 14 and held in place by a plate member 116. The resistance to the movement of the doors 102 can be provided by an axial compression member such as a friction washer, rubber O-ring, spring washer or the like. As shown in FIGS. 16-19 a compression spring washer 118 is positioned between the recess 114 and the face of the bearing end 110 to provide a frictional force to the access doors 102 to retain the access doors in place while allowing the user to open and close the access doors as needed. The compression spring washer 118 has a generally round perimeter and a first curved concave face and an opposite convex face that is compressed when inserted into the recess 114 to apply an axial compression or force from opposite ends of the access door 102.

Figure 20:
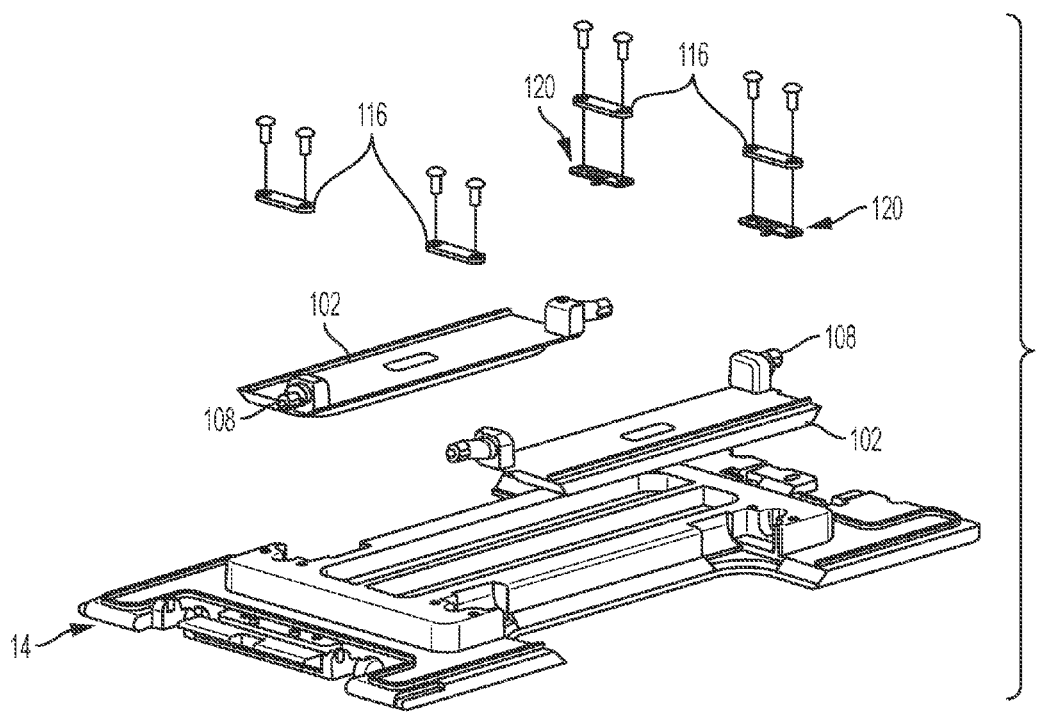
FIG. 20 is an exploded view of an exemplary cover assembly and access doors.
Figure 21:
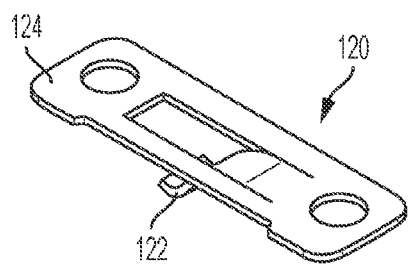
FIG. 21 is a top perspective view of an exemplary biasing member.
Figure 22:
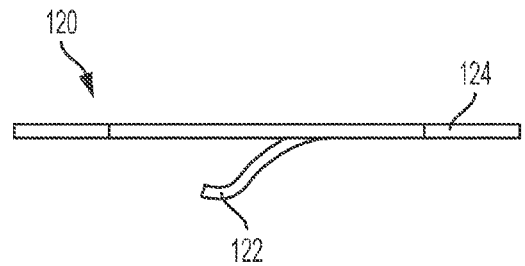
FIG. 22 is a side view of FIG. 21.

Other alternative embodiments utilize other biasing members engaging a portion of the access door 102 to provide resistance to the movement of the doors 102. One example of such a biasing member is a bracket 120 having a resilient arm 122 as shown in FIGS. 20-22. The bracket includes a base 124 having a pair of openings for receiving fasteners that connect the bracket 120 to the cover 14. The resilient arm 122 extends from the base and has first and second curved portions, for example a convex curve and a concave curve. In alternative embodiments, other sizes, shapes, and configurations can be used. The bracket 120 can be positioned between the plate members 116 and the cover 14, or otherwise attached to the cover. The resilient arm 122 extends to engage a portion of the door 102. In an exemplary embodiment the resilient arm 122 engages the hinge pins 108. In an exemplary embodiment the resilient arm 122 engages the hinge pin 108 and causes sufficient friction to retain the door 102 in a desired position.

Figure 24:
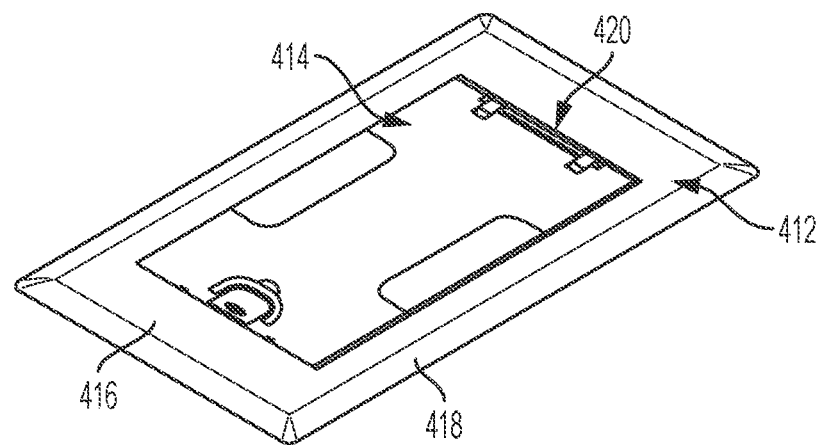
FIG. 24 is a top perspective view of another exemplary cover assembly.

FIG. 24 shows another exemplary embodiment of a base 212 and a cover 214. The base 212 and the cover 214 can be used with a larger electrical box, for example a 4, 6, 8, or 10 gang electrical box. The base 212 has a central opening 218 for allowing access to the electrical components within an electrical box. The base 212 has a top surface 220 and a recessed area defined by an inwardly extending flange 222. A side wall 232 extends between the flange 222 and the top surface 220 of the base 212 to define the depth of the recessed area. The cover 214 includes a pair of doors 302 over access openings to allow electrical cords to pass through the cover 214 in the closed position.

The cover 214 is pivotally coupled to the base 212 by a first hinge assembly 246A and a second hinge assembly 246B. The hinge assemblies 246A, 246B are configured to enable the cover 214 to pivot between a closed position and an open position. Preferably the hinge assemblies 246A, 246B allow the cover to pivot open so that the cover 214 lays flat on the top surface 220 of the base 212 and the surface of the floor in which the cover assembly and electrical box are mounted. Each hinge assembly 246A, 246B can include any of the components discussed above, for example a pair of hinge bodies 254A, 254B and a hinge pin 268A, 268B.

Figure 23:
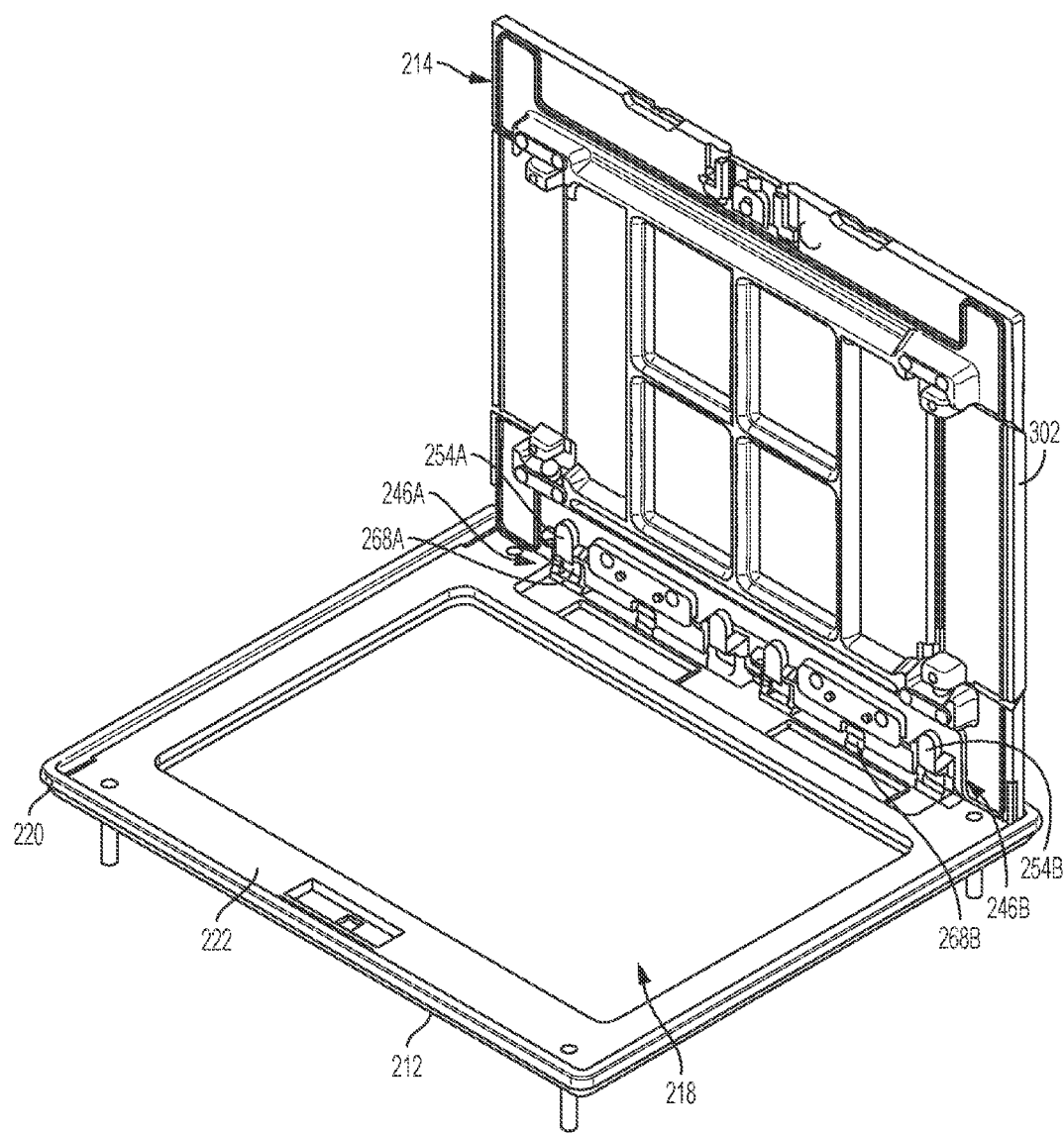
FIG. 23 is a top perspective view of another exemplary cover assembly.

Different configurations of bases and covers can be used for different sized boxes in different installations. For example, the base 12 and cover 14 shown in FIGS. 2-4 can be used with a 2 gang electrical box in a carpet installation. The base 212 and cover 214 shown in FIG. 23 can be used with a 4-10 gang electrical box in a tile installation.

FIG. 24 shows a base 412 and a cover 414 that can be used with a 2 gang electrical box in a concrete or raised access flooring installation. The base 412 includes a top surface 416 and a beveled edge 418 extending from the top surface to a lower edge of the base 412. The beveled edge 418 provides a smooth transition from the surface of the floor and the top surface 416 of the base and the cover 414. The wider base 412 and the beveled edge 418 extend over openings formed in the flooring to hide any rough edges, cracks, or other imperfections of safety hazards. The cover 414 is pivotally coupled to the base 412 by a hinge assembly 420 that enables the cover 414 to pivot between a closed position and an open position. The hinge assembly 420 allows the cover 414 to pivot open so that the cover 414 lays flat on the top surface 416 of the base 412.

Figure 25:
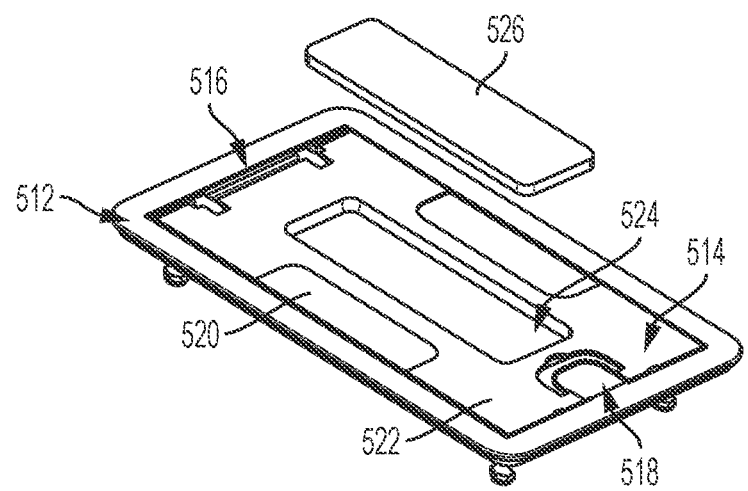
FIG. 25 is a top perspective view of another exemplary cover assembly.

FIG. 25 shows another exemplary embodiment of a cover assembly having a base 512 and a cover 514 pivotally coupled to the base 512 by a hinge assembly 516. A handle assembly 518 allows the cover 514 to be opened and closed. A pair of doors 520 are positioned to cover access openings that allow conductors to extend through the cover 514. The cover 514 includes a top surface 522. A recess 524 defined by a lower wall and one or more side walls extends from the top surface 522 of the cover 514. In an exemplary embodiment, the recess 524 has a substantially rectangular configuration with rounded corners and is positioned between the doors 520, the hinge assembly 516 and the handle assembly 518. The recess 524 is configured to receive a portion of a flooring material 526, for example a piece of carpet, tile, or other type of flooring. The top surface of the flooring 526 is flush with the top surface 522 of the cover 514 to provide a more concealed appearance to the cover assembly.

The foregoing detailed description of the certain exemplary embodiments has been provided for the purpose of explaining the general principles and practical application, thereby enabling others skilled in the art to understand the disclosure for various embodiments and with various modifications as are suited to the particular use contemplated. This description is not necessarily intended to be exhaustive or to limit the disclosure to the exemplary embodiments disclosed. Any of the embodiments and/or elements disclosed herein can be combined with one another to form various additional embodiments not specifically disclosed. Accordingly, additional embodiments are possible and are intended to be encompassed within this specification and the scope of the appended claims. The specification describes specific examples to accomplish a more general goal that may be accomplished in another way.

As used in this application, the terms "front," "rear," "upper," "lower," "upwardly," "downwardly," and other orientational descriptors are intended to facilitate the description of the exemplary embodiments of the present application, and are not intended to limit the structure of the exemplary embodiments of the present application to any particular position or orientation. Terms of degree, such as "substantially" or "approximately" are understood by those of ordinary skill to refer to reasonable ranges outside of the given value, for example, general tolerances associated with manufacturing, assembly, and use of the described embodiments.

What is claimed:

1. A cover assembly for a floor box comprising:
    a base defining a central opening for accessing a floor box;
    a cover moveable with respect to the base and sized to close the central opening;
    a hinge body connected to the cover and pivotally connected to the base;
    a hinge pin connected to the hinge body through an interference fit and connected to the base, wherein the interference fit includes a first friction feature formed on the hinge pin to resist relative movement of the hinge pin;
    a cord access opening in the cover; and
    an access door connected to the cover and moveable between an open position and a closed position.

2. The cover assembly of claim 1, wherein the first friction feature includes a knurled surface.

3. The cover assembly of claim 1, wherein the interference fit includes a second friction feature formed in the hinge body.

4. The cover assembly of claim 3, wherein the second friction feature includes a deformation of the hinge body.

5. The cover assembly of claim 1, wherein the first friction feature includes dimpling.

6. The cover assembly of claim 1, wherein the hinge body and the hinge pin are part of a first hinge assembly and a second hinge assembly includes a second hinge body connected to the cover and a second hinge pin connected to the second hinge body through.

7. A cover assembly for a floor box comprising:
    a base defining a central opening for accessing a floor box;
    a cover moveable with respect to the base and sized to close the central opening;
    a hinge assembly including a hinge body connected to the cover and pivotally connected to the base and a hinge pin connected to the hinge body through an interference fit;

a cord access opening in the cover;

an access door connected to the cover and moveable between an open position and a closed position; and a biasing member including a spring bracket for applying a force against the access door to retain the access door in a desired position.

8. The cover assembly of claim 7, wherein the spring bracket includes a base and a resilient arm.

9. The cover assembly of claim 8, wherein the access door includes a hinge pin and the resilient arm engages the hinge pin.

10. The cover assembly of claim 8, wherein the resilient arm includes a curved portion.

11. The cover assembly of claim 8, wherein the resilient arm includes a concave curved portion and a convex curved portion.

12. The cover assembly of claim 7, wherein the spring bracket is connected to the cover.

13. The cover assembly of claim 12, wherein the spring bracket includes an opening receiving a fastener that extends into the cover.

14. The cover assembly of claim 12, wherein the spring bracket is positioned between the cover and a plate member.

15. A cover assembly for a floor box comprising:

a base defining a central opening for accessing a floor box;

a cover moveable with respect to the base and sized to close the central opening, the cover having a recess formed in an upper surface;

a piece of flooring material positioned in the recess;

a hinge assembly pivotally connecting the cover to the base;

a cord access opening in the cover;

an access door connected to the cover and moveable between an open position and a closed position; and a biasing member including a spring bracket having a resilient arm for applying a force against the access door to retain the access door in a desired position.

16. The cover assembly of claim 15, wherein the cover has a first upper surface and the flooring material has a second upper surface flush with the first upper surface.

17. The cover assembly of claim 15, wherein the base is configured for a carpet installation, a tile installation, or raised access flooring installation.

18. The cover assembly of claim 15, wherein the base includes a flange having a beveled edge.

19. The cover assembly of claim 15, wherein the hinge assembly includes a hinge body connected to the cover and pivotally connected to the base and a hinge pin connected to the hinge body through an interference fit.

* * * * *